(12) United States Patent
Kodani et al.

(10) Patent No.: US 7,954,234 B2
(45) Date of Patent: Jun. 7, 2011

(54) METHOD OF MANUFACTURING A WIRING BOARD

(75) Inventors: Kotaro Kodani, Nagano (JP); Junichi Nakamura, Nagano (JP); Kentaro Kaneko, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 545 days.

(21) Appl. No.: 12/098,583

(22) Filed: Apr. 7, 2008

(65) Prior Publication Data
US 2008/0245549 A1 Oct. 9, 2008

(30) Foreign Application Priority Data
Apr. 9, 2007 (JP) .................................. 2007-101465

(51) Int. Cl.
*H01K 3/30* (2006.01)

(52) U.S. Cl. ................ 29/852; 29/830; 29/846; 216/18

(58) Field of Classification Search ............ 29/825, 29/830, 846, 952; 216/18
See application file for complete search history.

(56) References Cited

U.S. PATENT DOCUMENTS

| | | | | |
|---|---|---|---|---|
| 4,604,160 A | * | 8/1986 | Murakami et al. | 216/18 |
| 6,183,588 B1 | * | 2/2001 | Kelly et al. | 156/247 |
| 6,904,674 B2 | * | 6/2005 | Mune et al. | 29/852 |
| 7,057,279 B2 | * | 6/2006 | Ogawa | 257/728 |
| 7,193,311 B2 | * | 3/2007 | Ogawa et al. | 257/687 |
| 7,235,477 B2 | * | 6/2007 | Ogawa | 438/622 |
| 7,435,680 B2 | | 10/2008 | Nakamura | |
| 7,473,992 B2 | * | 1/2009 | Ogawa | 257/686 |

FOREIGN PATENT DOCUMENTS

| | | |
|---|---|---|
| JP | 2003-060356 | 2/2003 |
| JP | 2005-005742 | 1/2005 |
| JP | 2006-186321 | 7/2006 |

* cited by examiner

*Primary Examiner* — C. J Arbes
(74) *Attorney, Agent, or Firm* — Rankin, Hill & Clark LLP

(57) ABSTRACT

In a method of manufacturing a wiring board, the method includes: (i) forming a plurality of conductive patterns to come into contact with a support plate; (ii) forming a resin layer to cover the plurality of conductive patterns and to come into contact with the support plate; (iii) forming another conductive pattern connected to at least one of the plurality of conductive patterns; and (iv) removing the support plate. A first area of the support plate coming into contact with at least one of the plurality of conductive patterns in step (i) is different in surface roughness from a second area of the support plate coming into contact with the resin layer in step (ii).

6 Claims, 22 Drawing Sheets

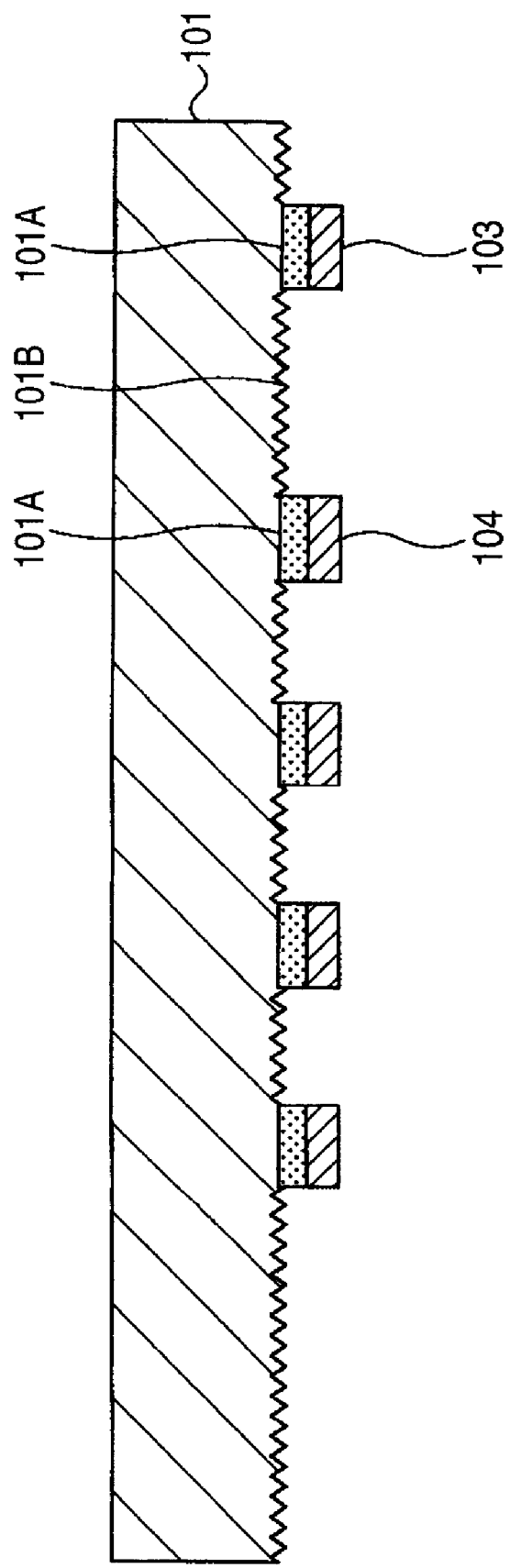

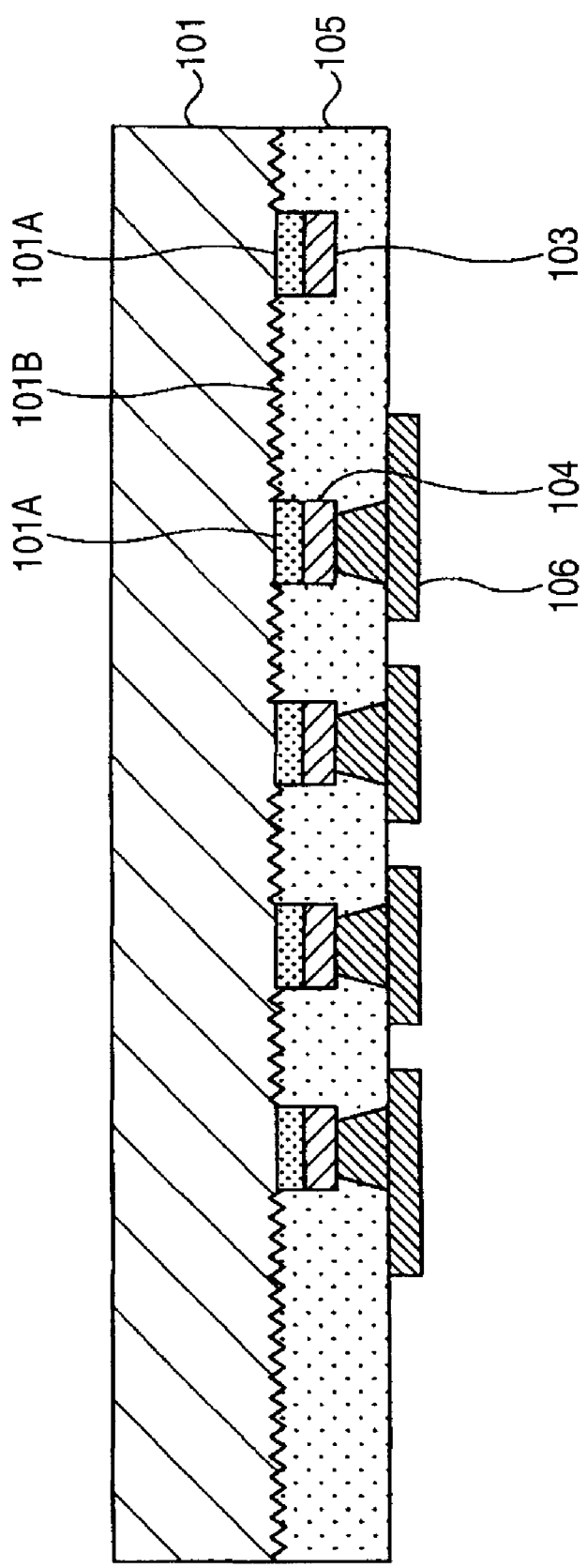

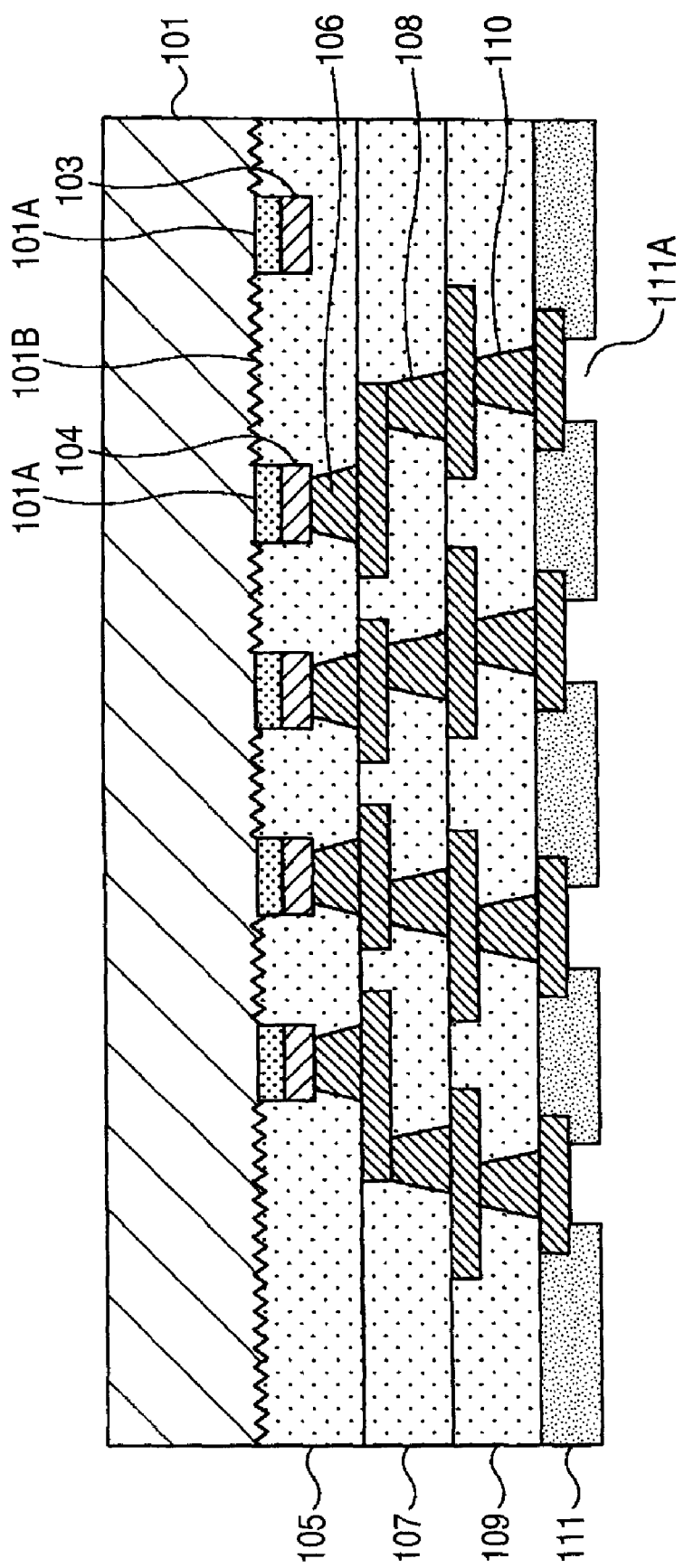

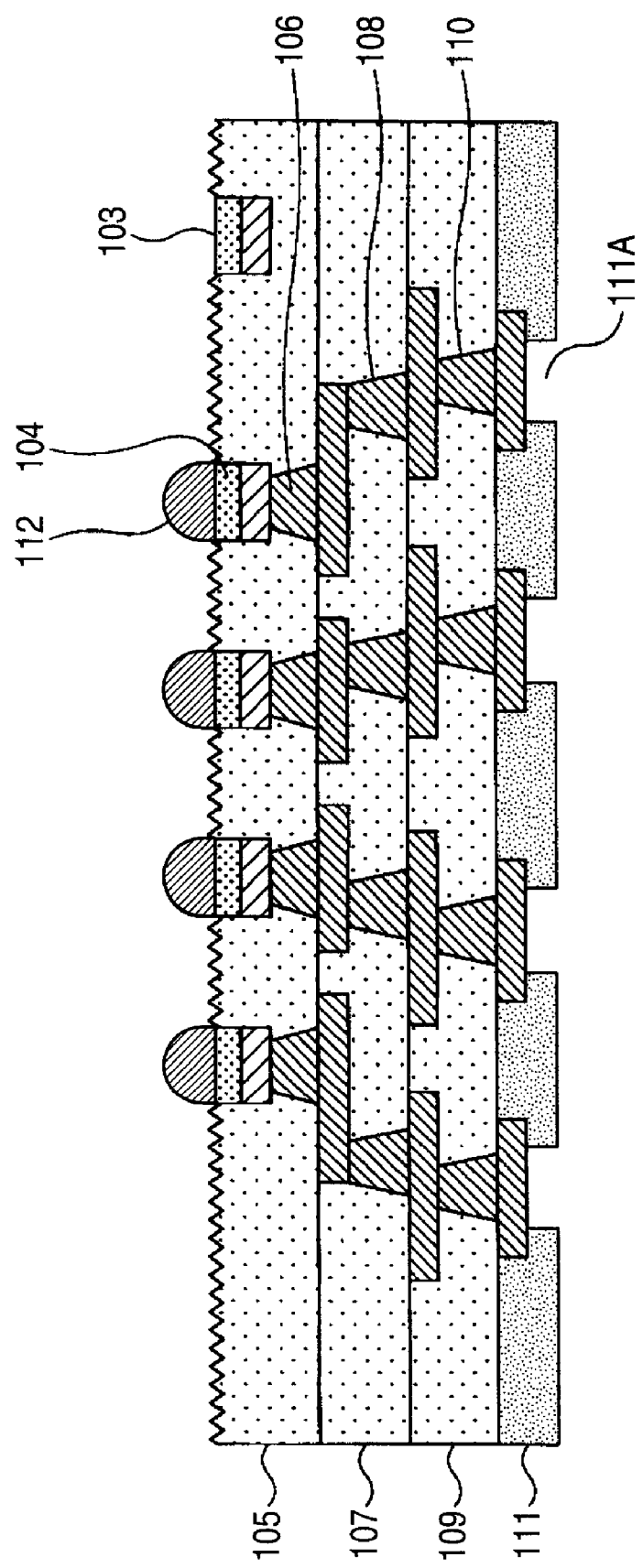

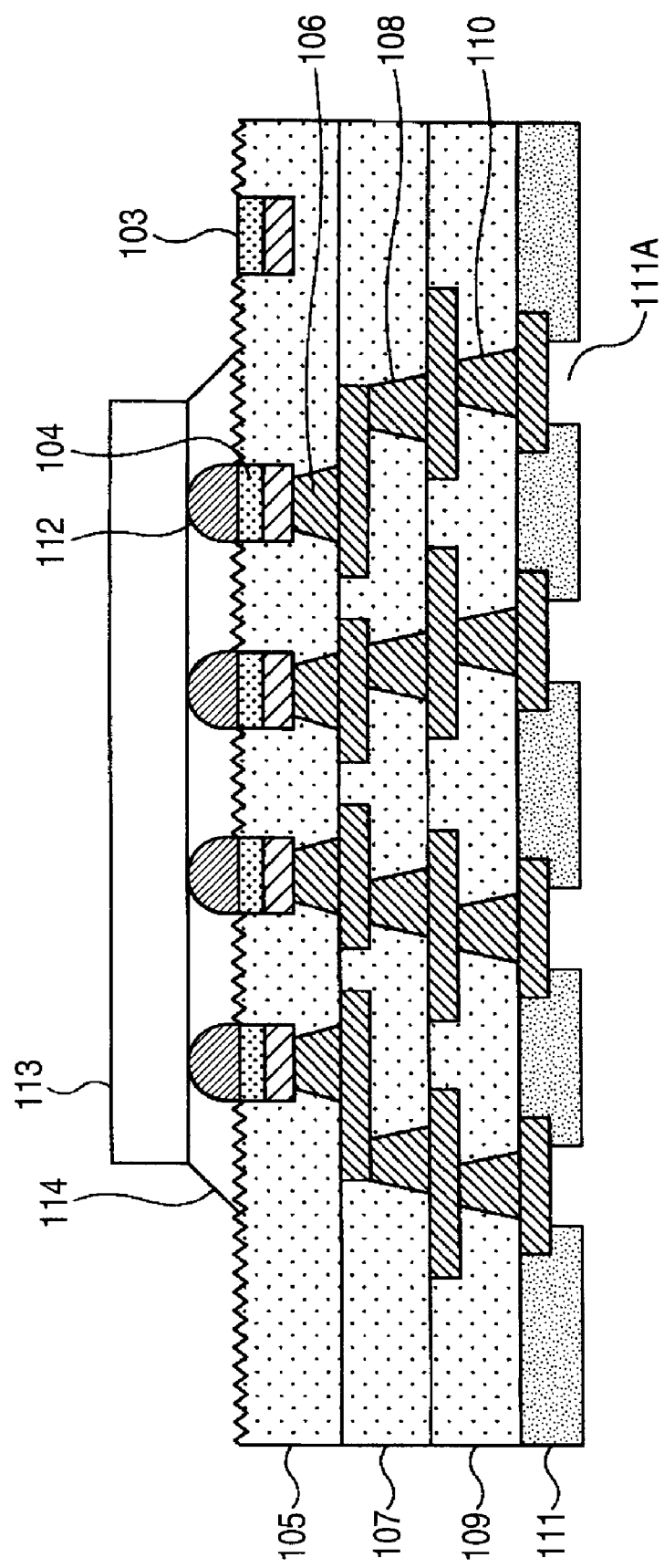

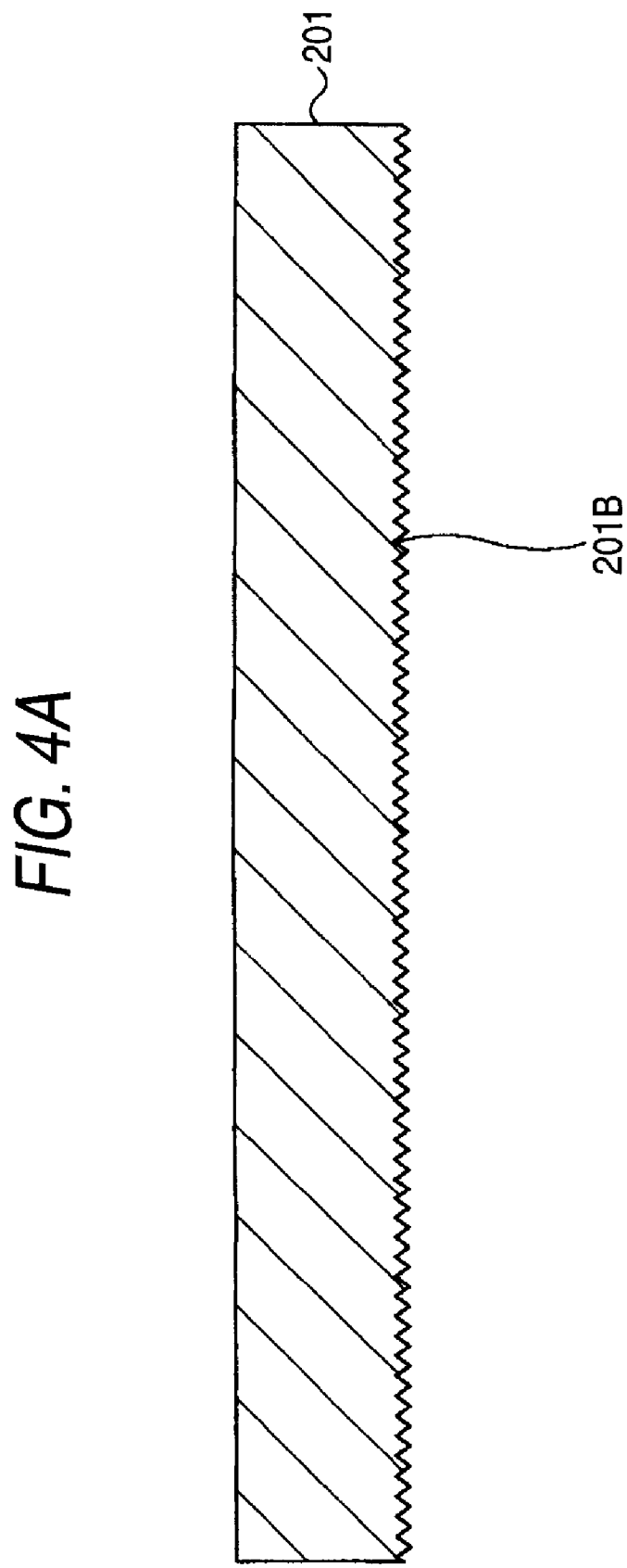

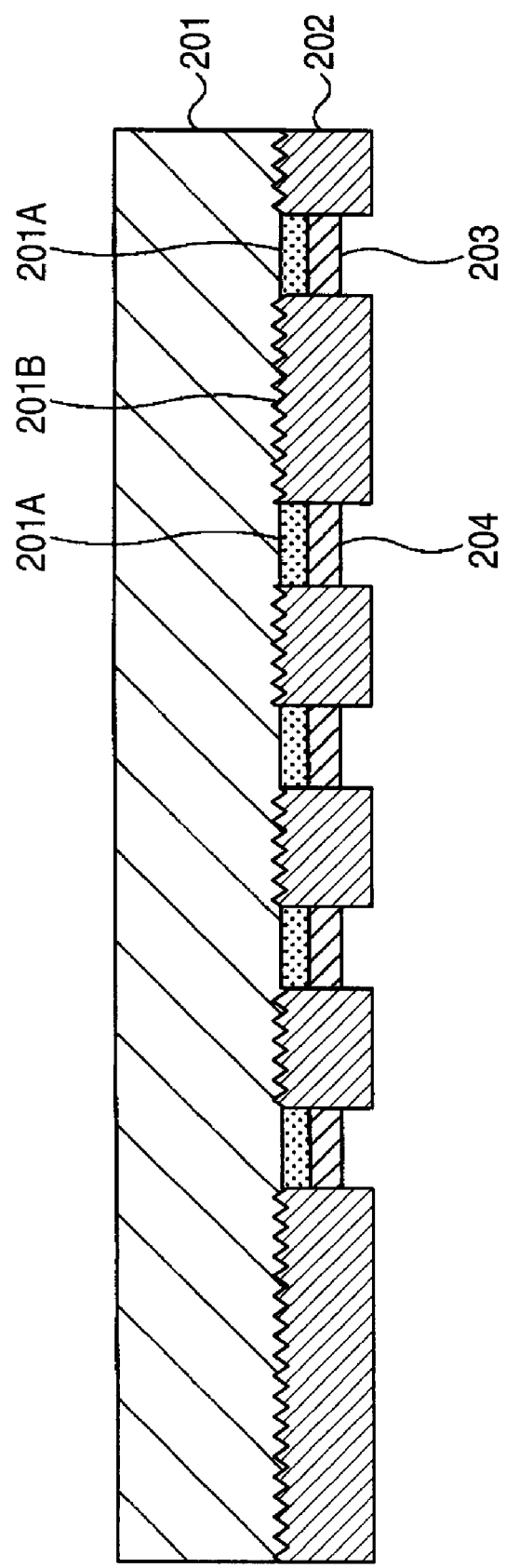

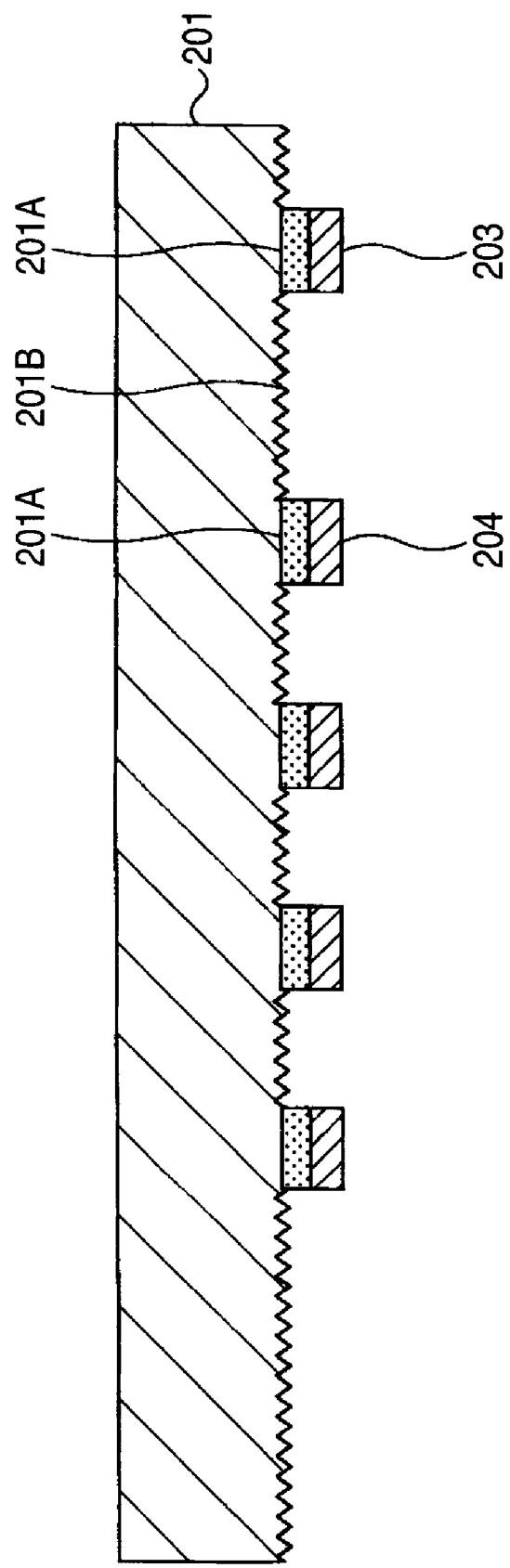

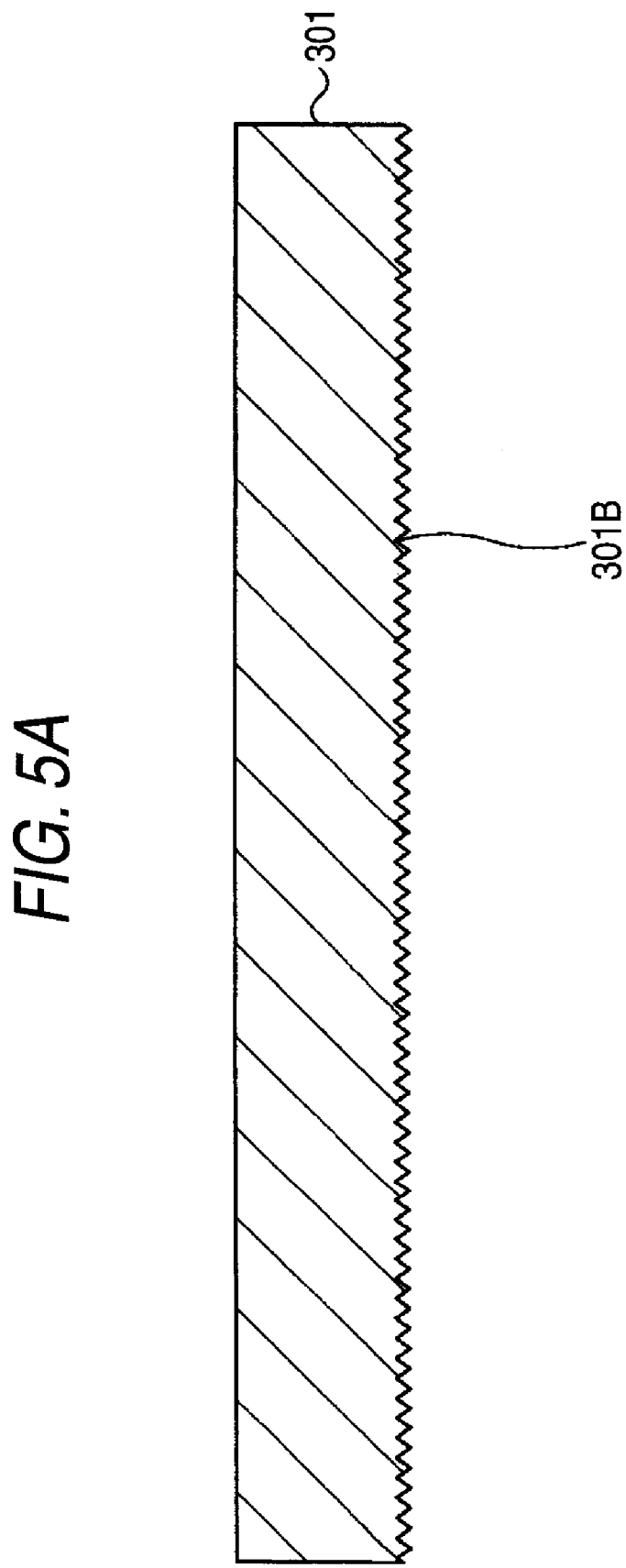

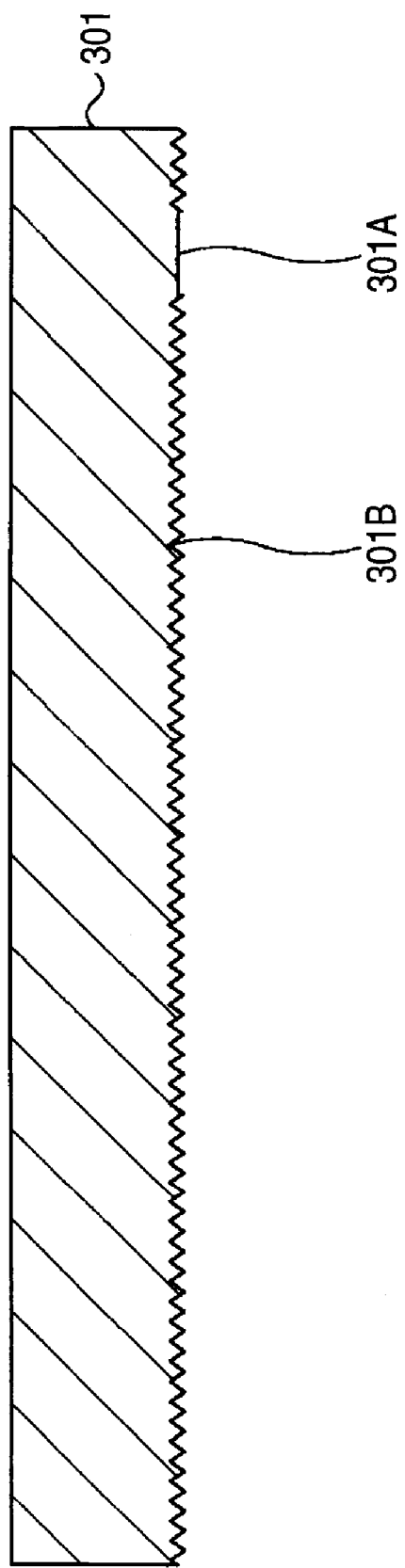

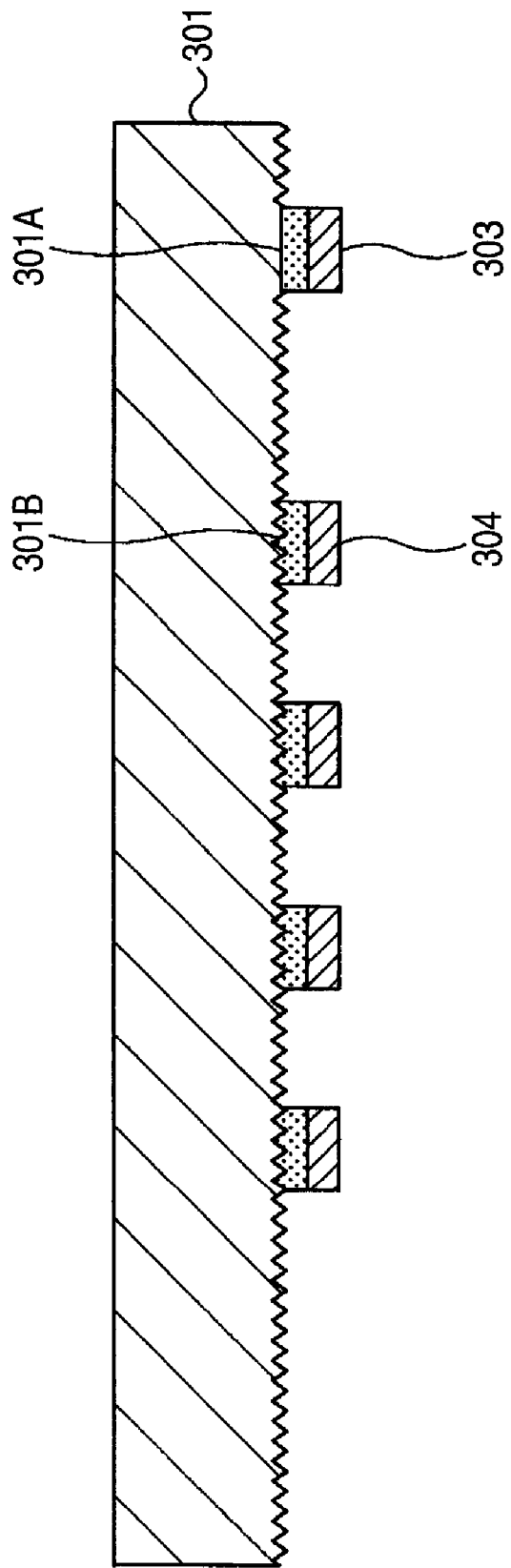

METHOD OF MANUFACTURING A WIRING BOARD

This application is based on and claims priority from Japanese Patent Applications No. 2007-101465, filed on Apr. 9, 2007, the entire contents of which are hereby incorporated by reference.

BACKGROUND OF THE INVENTION

1. Technical Field

The present disclosure relates to a wiring board having an electrode pad and an alignment mark and a method of manufacturing the wiring board.

2. Background Art

Various configurations of a wiring board (electronic device) have been proposed that mount components such as semiconductor chips. In recent years, there has been a significant demand for making a wiring board on which a semiconductor chip is mounted thin in thickness and small in size, as the semiconductor chip is made thin in thickness and small in size.

As a method of manufacturing the wiring board to be thin in thickness, for example, a so-called build-up method has been known. In the build-up method, a build-up layer (build-up resin) made of epoxy resin is stacked on a core board to form an interlayer insulating layer, thereby manufacturing a wiring board.

The core board is made of prepreg or the like. In a process of manufacturing a wiring board, the core board supports a soft built-up layer that has not been cured yet. In addition, the core board prevents the wiring board from being warped as the built-up layer is cured. However, when trying to make the core board further thinner in the aforementioned build-up method, there is a problem in thickness of the core board serving as a base of the wiring board.

In order to make the core board further thinner in the build-up method, there has been proposed a method in which a wiring board is formed on a support plate for supporting (build-up layer) the wiring board and then the support plate is removed (e.g., see Japanese Unexamined Patent Application Publication No. 2005-5742).

However, since adhesion is not strong between the support plate made of metal and the build-up layer made of resin, a countermeasure is needed to improve adhesion. As an example thereof, a method of improving adhesion to resin by roughening a metal surface has been studied.

However, when the support plate is roughened, the state of the roughened surface thereof is transferred to a surface of the wiring board. For example, when an alignment mark used for alignment (positioning) is formed on the surface of the wiring board coming into contact with the support plate, a surface of the alignment mark is roughened. Accordingly, it is difficult to recognize the alignment mark in positioning the wiring board, and thus reliability in process precision may decrease.

SUMMARY OF THE INVENTION

In order to solve the above problems, exemplary embodiments of the present invention provide a novel and useful method of manufacturing a wiring board and the wiring board.

A specific object of the present invention is to provide a method of manufacturing a wiring board and the wiring board, which enables the wiring board to be thinned and improves precision in alignment.

According to one or more aspects of the present invention, a method of manufacturing a wiring board includes: (i) forming a plurality of conductive patterns to come into contact with a support plate; (ii) forming a resin layer to cover the plurality of conductive patterns and to come into contact with the support plate; (iii) forming another conductive pattern connected to at least one of the plurality of conductive patterns; and (iv) removing the support plate, wherein a first area of the support plate coming into contact with at least one of the plurality of conductive patterns in step (i) is different in surface roughness from a second area of the support plate coming into contact with the resin layer in step (ii).

According to one or more aspects of the present invention, a wiring board includes: a resin layer; an alignment mark; and an electrode pad, wherein the alignment mark and the electrode pad are embedded in the resin layer, and one surfaces of the alignment mark and the electrode pad are exposed from the resin layer, and wherein the exposed surface of the resin layer is different in roughness from the exposed surface of at least one of the alignment mark and the electrode pad.

According to the present invention, a method of manufacturing a wiring board is provided which enables the wiring substrate to be thinned and improves precision in alignment.

Other aspects and advantages of the invention will be apparent from the following description, the drawings and the claims.

BRIEF DESCRIPTION OF THE DRAWINGS

FIG. 3C is a diagram (#3) illustrating a method of manufacturing an electronic device according to Embodiment 1;

FIG. 3E is a diagram (#5) illustrating a method of manufacturing an electronic device according to Embodiment 1;

FIG. 3F is a diagram (#6) illustrating a method of manufacturing an electronic device according to Embodiment 1;

FIG. 3H is a diagram (#8) illustrating a method of manufacturing an electronic device according to Embodiment 1;

FIG. 3I is a diagram (#9) illustrating a method of manufacturing an electronic device according to Embodiment 1;

FIG. 4A is a diagram (#1) illustrating a method of manufacturing an electronic device according to Embodiment 2;

FIG. 4D is a diagram (#4) illustrating a method of manufacturing an electronic device according to Embodiment 2;

FIG. 4E is a diagram (#5) illustrating a method of manufacturing an electronic device according to Embodiment 2;

FIG. 5A is a diagram (#1) illustrating a method of manufacturing an electronic device according to Embodiment 3;

FIG. 5D is a diagram (#4) illustrating a method of manufacturing an electronic device according to Embodiment 3;

FIG. 5G is a diagram (#7) illustrating a method of manufacturing an electronic device according to Embodiment 3.

DETAILED DESCRIPTION

Figure 1:
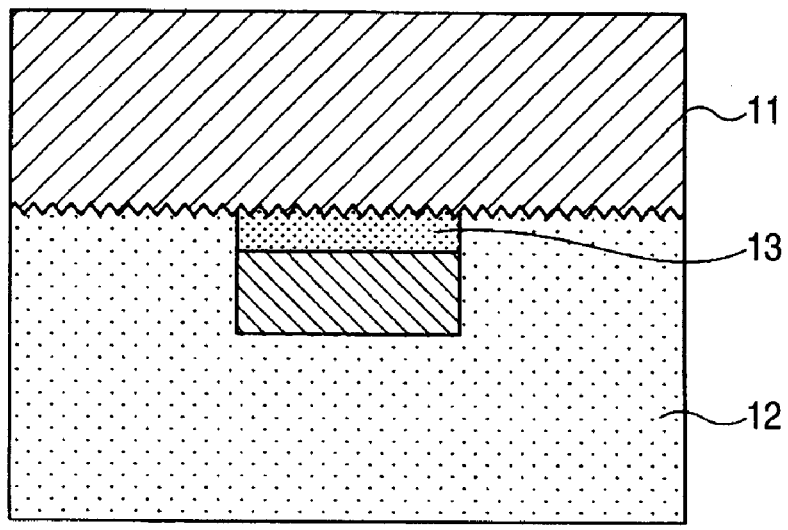
FIG. 1 is a schematic diagram illustrating a method of manufacturing an electronic device in the related art.

FIG. 1 is a schematic diagram illustrating a method of manufacturing a wiring board (electronic device) in the related art. Referring to FIG. 1, an alignment mark (conductive pattern) 13 and a resin layer 12 are formed on a support plate 11 made of a metal material such as Cu, and then the support plate 11 is removed by etching or the like, thereby forming a wiring board. For this reason, the manufactured wiring board can be thinned, while suppressing warpage of the resin layer in manufacturing the wiring board by using the support plate. In the figure, structures such as an electrode pad and a wiring structure are not shown.

However, in the aforementioned manufacturing method, in order to improve adhesion of the support plate 11 made of a metal material and the resin layer 12, there is a case that the surface of the support plate 11 is subjected to a roughening treatment to increase surface roughness. In this case, the surface roughness of the supports layer 11 is transferred to the wiring board side such as the resin layer 12 and the alignment mark 13.

For example, when the surface of the alignment mark 13 is roughened and thus the surface roughness becomes large, it may be difficult to recognize the alignment mark 13. For example, when the support plate 11 is removed and then a contact portion such as solder is formed on an electrode pad (not shown), it is difficult to recognize the alignment mark and thus a problem in processing precision of the wiring board occurs.

In the present invention, as described below, an area of the support plate coming into contact with the alignment mark is different in surface roughness from an area of the support plate coming into contact with the resin layer. For this reason, the surface roughness of the alignment mark is decreased while securing adhesion of the resin layer and the support plate, and thus it is easy to recognize the alignment mark.

Figure 2:
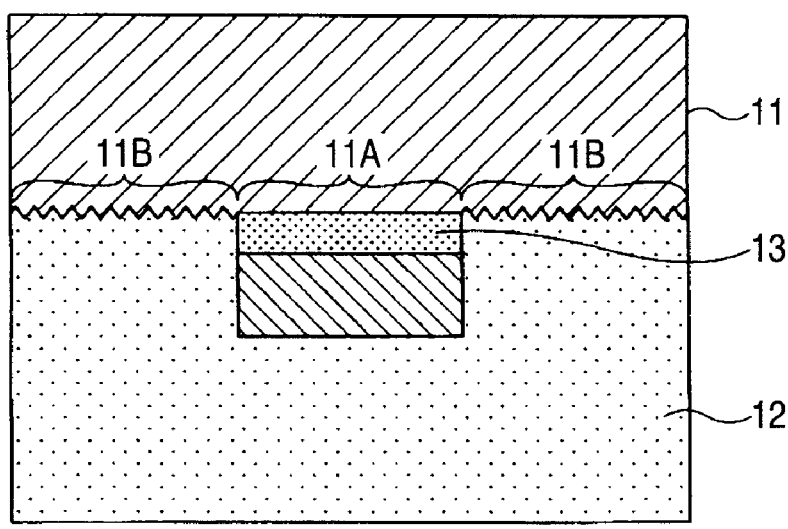
FIG. 2 is a schematic diagram illustrating a method of manufacturing an electronic device according to the present invention.

FIG. 2 is a schematic diagram illustrating a method of manufacturing a wiring board (electronic device) according to the invention. The same reference numerals are given to the aforementioned parts, and description thereof is omitted. Referring to FIG. 2, as shown in the figure, a first area (non-rough surface) 11A and a second area (rough surface) 11B different in surface roughness from each other are formed on a surface of the support plate 11 made of Cu, coming into contact with the wiring board.

For example, the first area 11A has surface roughness (Ra) such as surface finishing of the general metal plate (Cu plate), the surface roughness thereof is smaller than that of the second area 11B, and Ra representing surface roughness is 100 nm or less. The second area 11B is formed by roughening treatment, the surface roughness thereof is large than that of the first area 11A, and Ra representing surface roughness is about 200 nm to 600 nm.

For this reason, since the surface state of the smooth first area 11A is transferred to the alignment mark (conductive pattern) 13 as it is, the surface roughness of the alignment mark 13 becomes small. Accordingly, it is easy to recognize the alignment mark after removing the support plate 11, thereby improving precision in alignment.

In addition, since adhesion between the second area 11B (rough surface) having the large surface roughness and the resin layer 12 coming into contact with the second area 11B is improved, it is possible to prevent the resin layer 12 from peeling off in the process of manufacturing the wiring board.

Although not shown in FIG. 2, an electrode pad (conductive pattern) is formed on the same plane as that of the alignment mark, a conductive pattern such as a pattern wiring and a via plug, connected to the electrode pad is formed, and then the support plate 11 is removed by etching. The alignment mark and the electrode pad may be commonly used for each other, and the alignment may be performed using the electrode pad.

Further, when the electrode pad is smoother than the resin layer 12 in the periphery thereof, it is possible to perform an excellent alignment. Moreover, by using the electrode pad as an alignment mark, visibility is improved in the alignment. When the alignment mark and the electrode pad are formed on a surface of the wiring board on which a chip is to be mounted, precision in mounting the chip is greatly improved.

As described above, it is possible to manufacture the wiring board (electronic device), which is easily made thin with high precision in alignment.

When the plurality of areas different in surface roughness from each other are formed on the support plate 11, there are, for example, 1) a method (first method) of forming a conductive pattern such as an alignment mark and an electrode pad on the surface of the support plate and then roughening the surface of the support plate using the conductive patterns as a mask, and 2) a method (second method) of roughening the whole surface of the support plate, forming a mask pattern covering the surface, and then smoothening the roughened surface exposed from the mask pattern.

Next, more detailed examples of the method of manufacturing the wiring board using the first method and the second method will be sequentially described with reference to Embodiment 1 and Embodiment 2.

EMBODIMENT 1

FIGS. 3A to 3I are diagrams sequentially illustrating a method of manufacturing a wiring board (electronic device) according to Embodiment 1. In the figures, the same reference numerals are given to the above-described parts, description of which may be omitted (the same is applied to the following embodiments and figures).

Figure 3A:
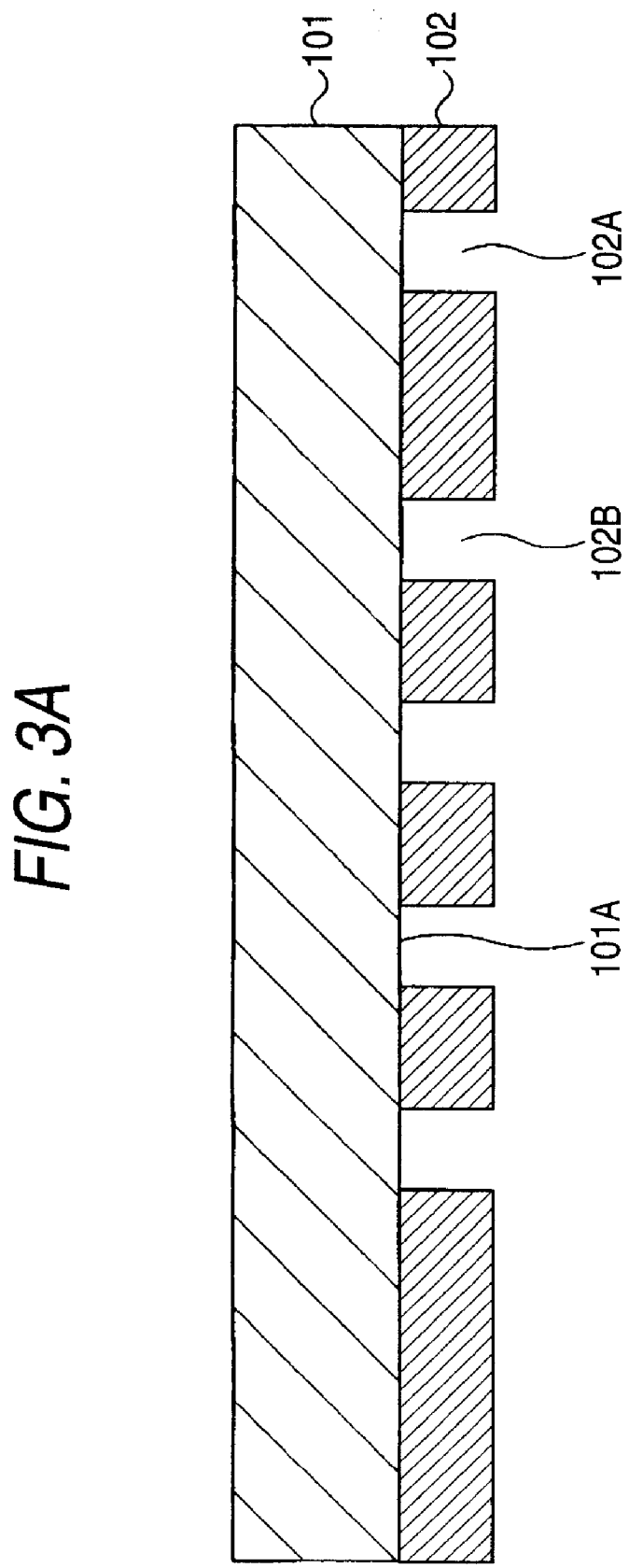
FIG. 3A is a diagram (#1) illustrating a method of manufacturing an electronic device according to Embodiment 1.

In the process shown in FIG. 3A, a mask pattern 102 having openings 102A and 102B is formed on a support plate 101, which is formed of Cu film by electroplating, by photolithography using resist. The surface of the support plate 101A is in the general metal plate state, and the surface is a non-rough surface (first area) 101A having Ra of 100 nm or less. The support plate is not limited to metal film (Cu film), but the general metal plate may be used as the support plate.

Figure 3B:
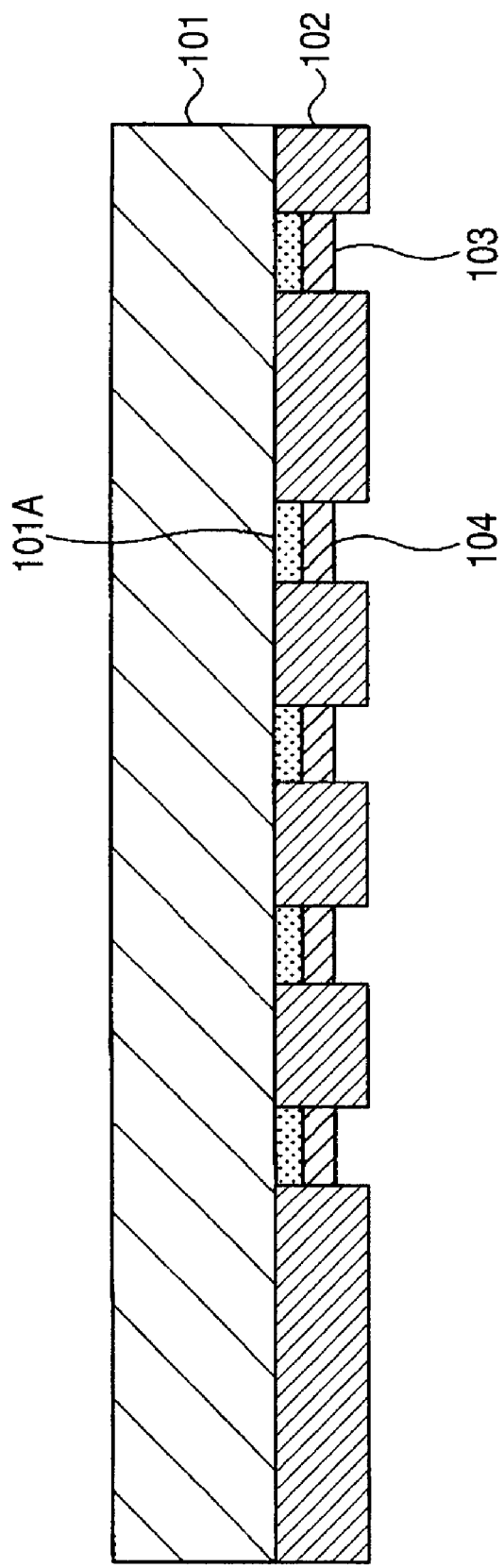
FIG. 3B is a diagram (#2) illustrating a method of manufacturing an electronic device according to Embodiment 1.

In the process shown in FIG. 3B, an alignment mark (conductive pattern) 103 and an electrode pad (conductive pattern) 104 are formed to come into contact with the surface (first area 101A) of the support plate 101 exposed from the openings 102A and 102B. That is, the alignment mark 103 and the electrode pad 104 are formed on the first area (non-rough surface) 101A small in surface roughness on the support plate 101.

For example, the alignment mark 103 and the electrode pad 104 are formed on the same plane and are formed by the same process and manner. For example, the alignment mark 103 and the electrode pad 104 are formed by electroplating, where the support plate 101 made of a conductive material is used as a feed path. In addition, the conductive pattern such as the alignment mark 103 and the electrode pad 104 is formed with a stacked structure of an Au layer and a Ni layer (the Au layer is close to the support plate 101), but is not limited thereto. Various structures may be used, for example, an Au layer, a Ni layer, and a Cu layer (the Au layer is close to the support plate 101), or a stacked structure of an Au layer and a Cu layer (the Au layer is close to the support plate 101).

In the process shown in FIG. 3C, the mask pattern 102 formed on the support plate 101 is removed. In this case, after removing the mark pattern 102, for example, a wet treatment is performed by chemicals containing organic acid such as formic acid, the surface of the support plate 101 is roughened, and an area of the support plate 101 that is not covered with the alignment mark 103 and the electrode pad 104 (conductive pattern) becomes a rough surface (second area) 101B. That is, the surface (first area) 101A of the support plate 101 is roughened by the wet treatment in which the conductive pattern including the alignment mark 103 and the electrode pad 104 is used as a mask. In this case, Ra that is surface roughness of the second area 101B is preferably 200 nm to 600 nm (e.g., 400 nm).

Figure 3D:
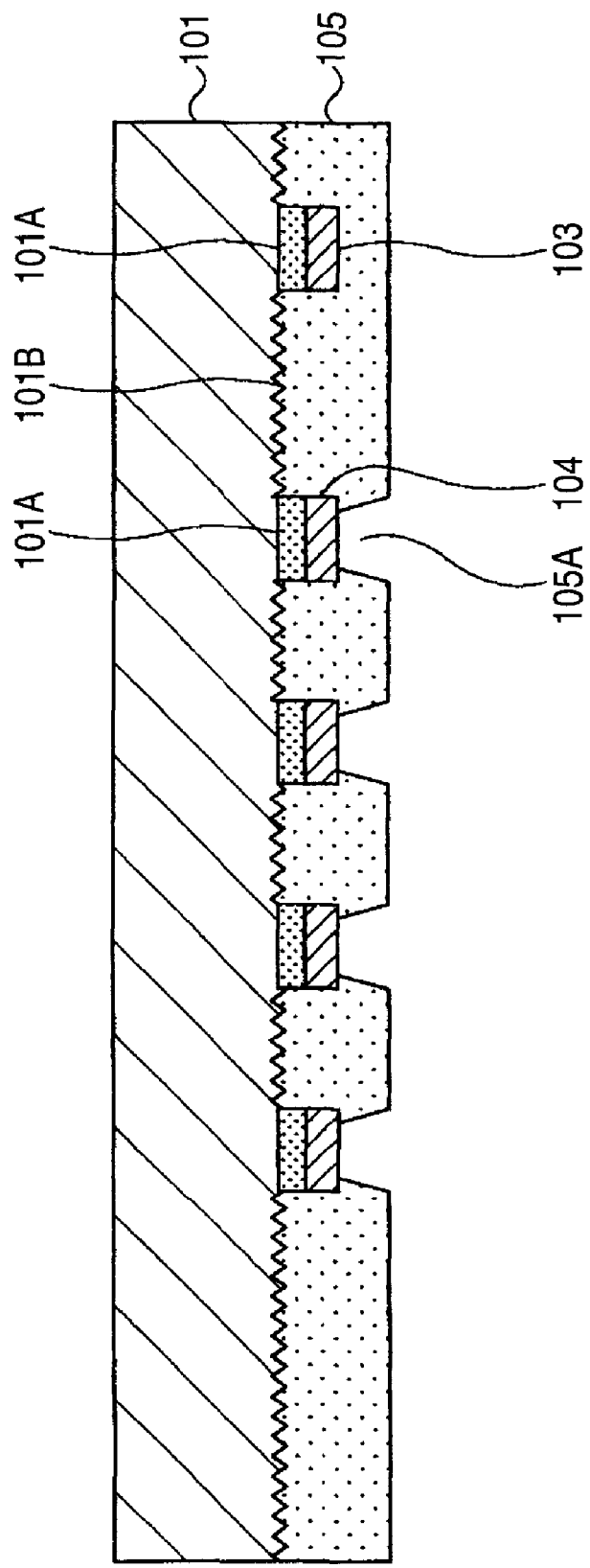
FIG. 3D is a diagram (#4) illustrating a method of manufacturing an electronic device according to Embodiment 1.

In the process shown in FIG. 3D, for example, an epoxy-based resin layer (build-up layer) 105 is formed to cover the alignment mark 103 and the electrode pad 104 and to come into contact with the rough surface (second area) 101B of the support plate 101. A via hole 105A reaching the electrode pad 104 is formed on the resin layer 105, for example, by laser.

In the process shown in FIG. 3E, a seed layer (now shown) is formed on the surface of the resin layer 105 by electroless plating of Cu, and then a resist pattern (not shown) is formed on the seed layer. The via hole is filled with a via plug, and a conductive pattern (another conductive pattern) 106 including a pattern wiring connected with the via plug is formed. After forming the conductive pattern 106, the resist pattern is peeled off, and the seed layer exposed by the peeling off the resist layer is removed by etching.

In the process shown in FIG. 3F, the processes described with reference to FIGS. 3D and 3E are repeated to sequentially form resin layers 107 and 109 corresponding to the resin layer 105 on the resin layer 105, and conductive patterns 108 and 110 corresponding to the conductive pattern 106 are formed.

An insulating layer 111 formed of solder resist and having an opening 111A, through which a part of the conductive pattern 110 is exposed, is formed on the resin layer 109.

Figure 3G:
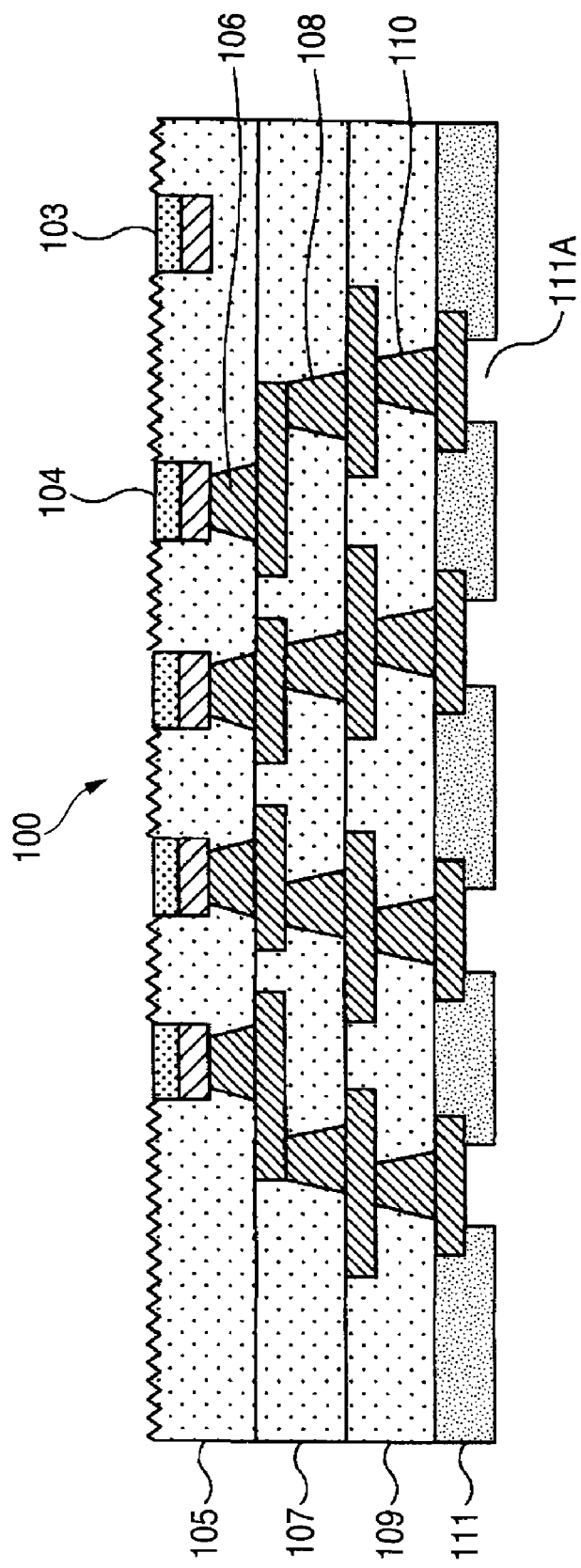
FIG. 3G is a diagram (#7) illustrating a method of manufacturing an electronic device according to Embodiment 1.

In the process shown in FIG. 3G the support plate 101 made of Cu is removed, for example, by wet etching using chemicals. In such a manner, the wiring board (electronic device) 100 may be formed.

In the wiring board 100, since the alignment mark (conductive pattern) 103 is formed to come into contact with the first area 101A that is the non-rough surface of the support plate 101, the surface of the alignment mark 103 is smooth. For example, when a contact portion such as solder is formed on the electrode pad 104, precision in alignment is improved. In addition, since the resin layer 105 is formed to come into contact with the second area 101B that is the rough surface of the support plate 101, adhesion between the support plate 101 and the resin layer 105 is improved. Accordingly, the resin layer is prevented from peeling off in manufacturing the wiring board, and thus it is possible to manufacture the wiring board with high reliability. The alignment mark and the electrode pad may be formed separately, but at least a part of the plurality of electrode pads may be used as the alignment mark (i.e., common use for both of the electrode pad and the alignment mark).

A contact portion may be formed on the wiring board 100 as described below to mount components such as semiconductor chips.

For example, as shown in FIG. 3H, alignment is performed using the alignment mark 103. Then, a contact portion 112 formed of solder is formed on the electrode pad 104, for example, by printing, or by transfer of a solder ball and reflow of the solder.

In the process shown in FIG. 3I, a component 113 such as a semiconductor chip is mounted to connect with the contact portion 112, and a space between the component 113 and the resin layer 105 may be filled with a resin material 114 such as underfill.

The component 113 may be mounted to connect with the conductive pattern 110 exposed from the opening 111A of the insulating layer 111. The supporting plate 101 may be removed after mounting the component 113 on the wiring board 100.

EMBODIMENT 2

FIGS. 4A to 4E are diagrams sequentially illustrating a method of manufacturing a wiring board (electronic device) according to Embodiment 2.

In the process shown in FIG. 4A, a surface of a support plate 201 made of metal such as Cu is subjected to a wet treatment using chemicals containing organic acid such as formic acid, and a rough surface (second area) 201B is formed. In this case, Ra that is surface roughness of the second area 201B is preferably 200 nm to 600 nm (e.g., 400 nm).

Figure 4B:
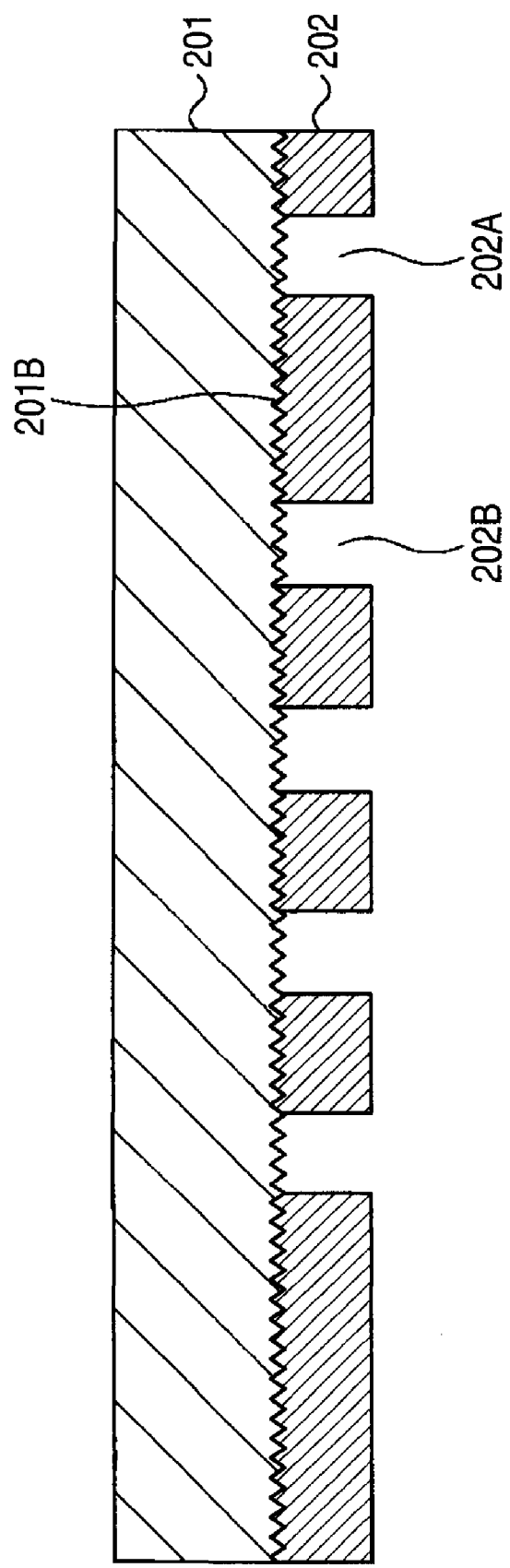
FIG. 4B is a diagram (#2) illustrating a method of manufacturing an electronic device according to Embodiment 2.

In the process shown in FIG. 4B, a mask pattern 202 having openings 202A and 202B is formed on the second area 201B of the support plate 201.

Figure 4C:
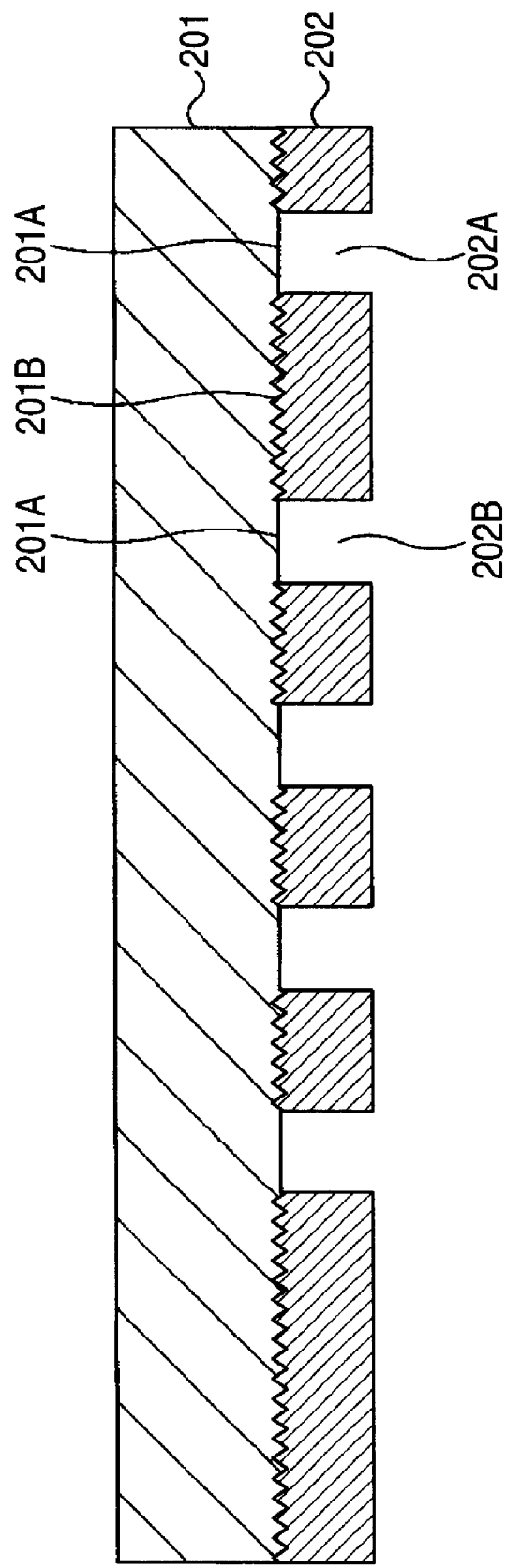
FIG. 4C is a diagram (#3) illustrating a method of manufacturing an electronic device according to Embodiment 2.

In the process shown in FIG. 4C, the second area 201B exposed from the openings 202A and 202B of the mask pattern 202 is smoothened by a wet treatment using chemicals containing, for example, sodium persulfate to form a non-rough surface (first area 201A). For example, Ra that is surface roughness of the first area 201A is preferably 100 nm or less.

In the process shown in FIG. 4D, an alignment mark 203 and an electrode pad 204 are formed to come into contact with the surface (first area 201A) of the support plate 201 exposed from the openings 202A and 202B. That is, the alignment mark 203 and the electrode pad 204 are formed on the first area (non-rough surface) 201A small in surface roughness on the support plate 201. For example, the alignment mark 203 and the electrode pad 204 may be formed in the same manner as the case of the alignment mark 103 and the electrode pad 104 described in Embodiment 1.

In the process shown in FIG. 4E, the mask pattern 202 formed on the support plate 201 is removed.

Then, the same processes as the processes after the process shown in FIG. 3D of Embodiment 1 are performed to form the resin layers 105, 107, and 109, the insulating layer 111, the conductive patterns 106, 108, and 110, and the contact portion 112 as necessary, as shown in Embodiment 1. Then, a component is mounted thereon, thereby manufacturing the wiring board (electronic device).

In the present embodiment, the same effect as Embodiment 1 is also exhibited, the surface of the alignment mark 203 is smooth, precision in alignment is improved, and the resin layer coming into contact with the support plate 201 is prevented from peeling off.

EMBODIMENT 3

In Embodiment 1 and Embodiment 2, both of the alignment mark and the electrode pad are formed corresponding to the non-rough surface, but the invention is not limited thereto. For example, at least the alignment mark of the alignment mark and the electrode pad may be formed corresponding to the non-rough surface, and the electrode pad may be formed corresponding to the rough surface, as described below.

FIGS. 5A to 5G are diagrams illustrating a method of manufacturing a wiring board (electronic device) according to Embodiment 3 of the invention.

In the process shown in FIG. 5A, a surface of a support plate 301 made of metal such as Cu is subjected to a wet treatment using chemicals containing organic acid such as formic acid, and a rough surface (second area) 301B is formed. In this case, Ra that is surface roughness of the second area 301B is preferably 200 nm to 600 nm (e.g., 400 nm).

Figure 5B:
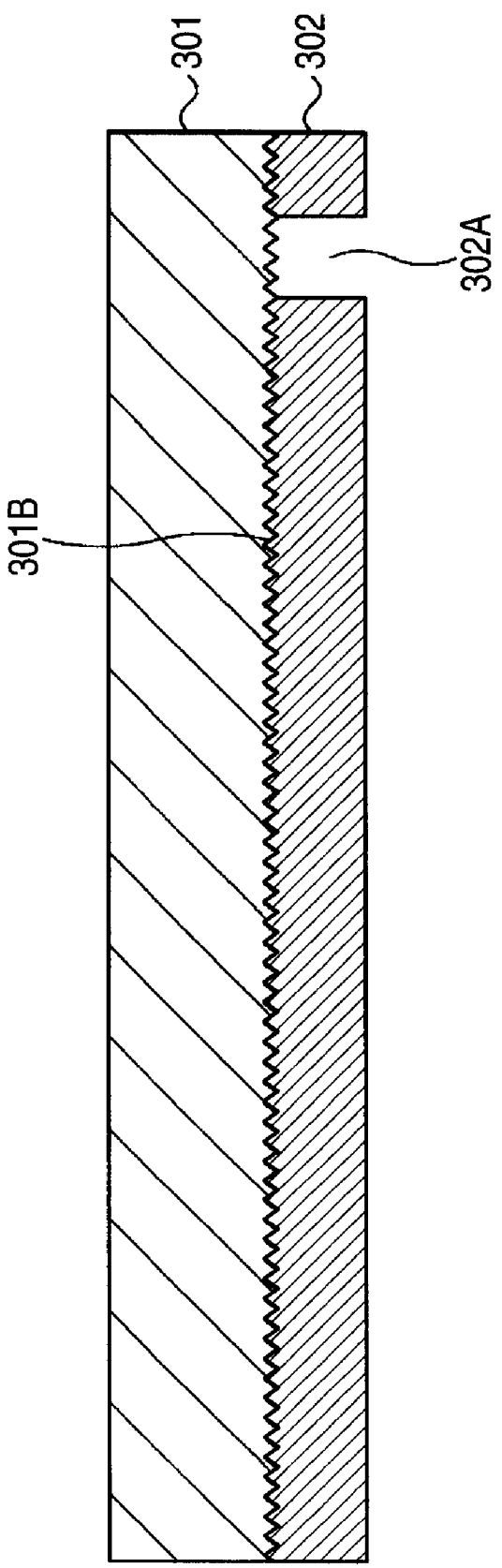
FIG. 5B is a diagram (#2) illustrating a method of manufacturing an electronic device according to Embodiment 3.

In the process shown in FIG. 5B, a mask pattern 302 having an opening 302A is formed on the second area 301B of the support plate 301.

Figure 5C:
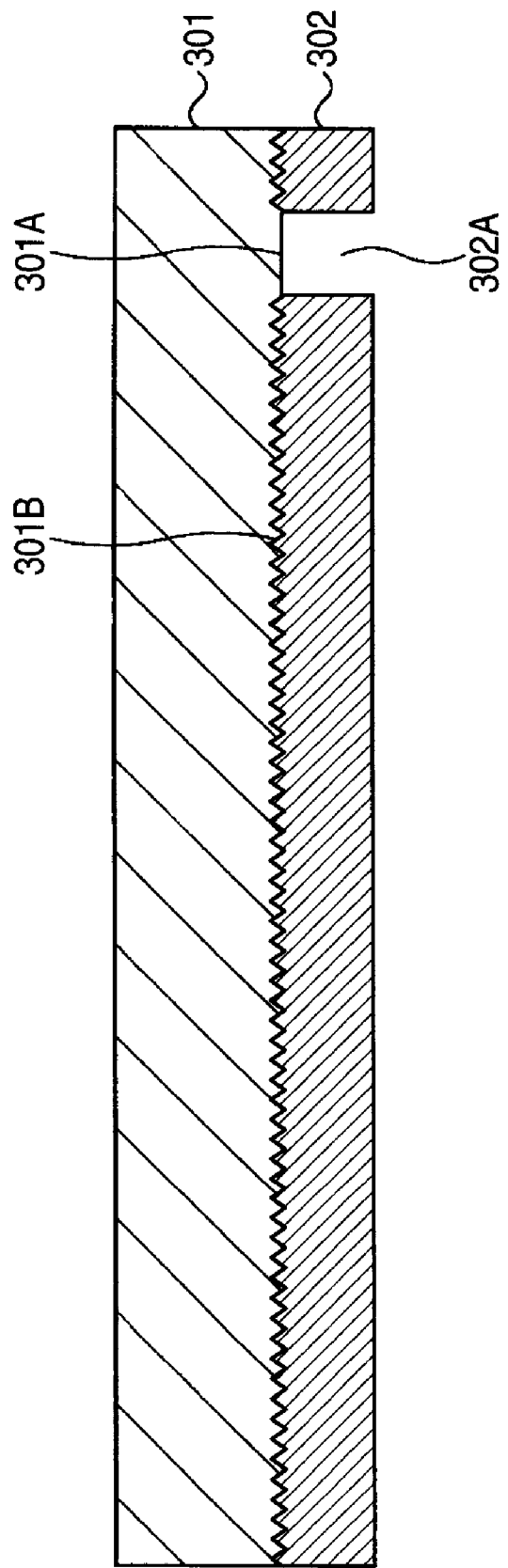
FIG. 5C is a diagram (#3) illustrating a method of manufacturing an electronic device according to Embodiment 3.

In the process shown in FIG. 5C, the second area 301B exposed from the opening 302A of the mask pattern 302 is smoothened by a wet treatment using chemicals containing, for example, sodium persulfate to form a non-rough surface (first area 301A). For example, Ra that is surface roughness of the first area 301A is preferably 100 nm or less.

In the process shown in FIG. 5D, the mask pattern 302 is removed.

Figure 5E:
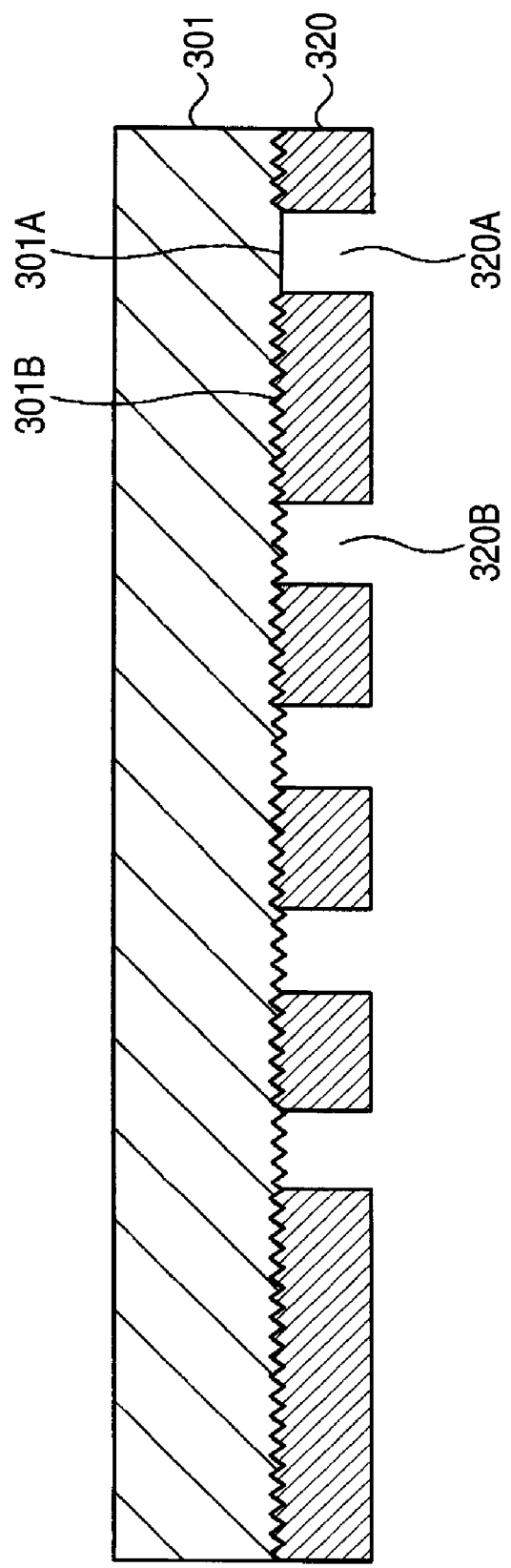
FIG. 5E is a diagram (#5) illustrating a method of manufacturing an electronic device according to Embodiment 3.

In the process shown in FIG. 5E, a mask pattern 320 having openings 320A and 320B is formed on the support plate 301. In this case, the first area (non-rough surface) 301A is exposed from the opening 320A, and the second area (rough surface) 301B is exposed from the opening 320B. That is, the opening 320A is formed corresponding to the opening 302A formed in the process shown in FIG. 5C.

Figure 5F:
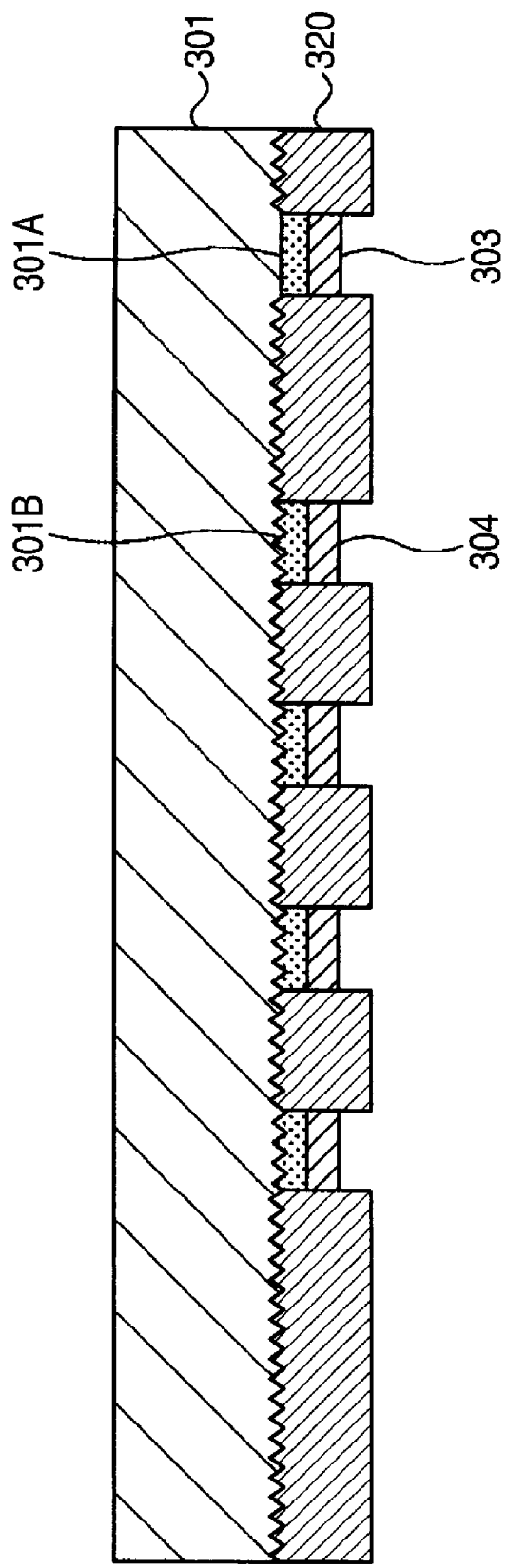
FIG. 5F is a diagram (#6) illustrating a method of manufacturing an electronic device according to Embodiment 3.

In the process shown in FIG. 5F, an alignment mark 303 and an electrode pad 304 are formed to come into contact with the surface of the support plate 301 exposed from the openings 320A and 320B. That is, the alignment mark 303 is formed on the first area (non-rough surface) 301A small in surface roughness on the support plate 301, and the electrode pad 304 is formed on the second area 301B large in surface roughness on the support plate 301. For example, the alignment mark 303 and the electrode pad 304 may be formed in the same manner as the case of the alignment mark 103 and the electrode pad 104 described in Embodiment 1.

In the process shown in FIG. 5G, the mask pattern 320 formed on the support plate 301 is removed.

Then, the same processes as the processes after the process shown in FIG. 3D of Embodiment 1 are performed to form the resin layers 105, 107, and 109, the insulating layer 111, the conductive patterns 106, 108, and 110, and the contact portion 112 as necessary, as shown in Embodiment 1. Then, a component is mounted thereon, thereby manufacturing the wiring board (electronic device).

In the present embodiment, the same effect as Embodiment 1 is also exhibited, the surface of the alignment mark 303 is smooth, precision in alignment is improved, and the resin layer coming into contact with the support plate 301 is prevented from peeling off.

As described in the embodiment, the electrode pad does not necessarily have the same surface roughness as that of the alignment mark, but may have surface roughness substantially equal to that of the resin layer.

According to the present invention, it is possible to provide a method of manufacturing a wiring board, which enables the wiring board to be thinned and improves precision in alignment.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. A method of manufacturing a wiring board, the method comprising:
   (a) roughening a surface of a support plate;
   (b) forming a mask pattern on the surface of the support plate and smoothening a surface of the support plate which is exposed from the mask pattern;
   (c) forming a plurality of conductive patterns on the supporting plate such that the plurality of conductive patterns come into contact with the support plate;
   (d) forming a resin layer to cover the plurality of conductive patterns and to come into contact with the support plate;
   (e) forming another conductive pattern connected to at least one of the plurality of conductive patterns; and
   (f) removing the support plate,
   wherein at least one of the plurality of conductive patterns is formed on the smoothened surface of the support plate, and
   wherein a first area of the support plate coming into contact with at least one of the plurality of conductive patterns in step (c) is different in surface roughness from a second area of the support plate coming into contact with the resin layer in step (d).

2. The method of claim 1, comprising the further steps of:
   (g) removing the mask pattern between step (c) and step (d).

3. The method of claim 1, wherein the plurality of conductive patterns includes an alignment mark and an electrode pad.

4. The method of claim 1, wherein step (c) comprises:
   (i) removing the mask pattern;
   (ii) forming a resist having openings therein on the surface of the support plate such that the smoothened surface of the support plate is exposed from the openings;
   (iii) forming the plurality of conductive patterns in the openings such that the plurality of conductive patterns come into contact with the support plate; and,
   (iv) removing the resist.

5. The method of claim 3, wherein the alignment mark is formed on the smoothened surface of the support plate.

6. The method of claim 1, wherein the plurality of conductive patterns is formed by electroplating in which the support plate is used as a feed path.

* * * * *